(12) United States Patent
Wong et al.

(10) Patent No.: US 7,586,315 B2
(45) Date of Patent: Sep. 8, 2009

(54) SYSTEM AND METHOD FOR TESTING VOLTAGE ENDURANCE

(75) Inventors: Shih-Fang Wong, Taipei Hsien (TW); Tsung-Jen Chuang, Taipei Hsien (TW); Jun Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 104 days.

(21) Appl. No.: 11/836,795

(22) Filed: Aug. 10, 2007

(65) Prior Publication Data
US 2008/0157788 A1 Jul. 3, 2008

(30) Foreign Application Priority Data
Dec. 27, 2006 (CN) .................. 2006 1 0157994

(51) Int. Cl.
*G01R 27/08* (2006.01)
(52) U.S. Cl. .................. 324/713; 324/765; 324/769
(58) Field of Classification Search .................. 324/713, 324/765, 769
See application file for complete search history.

(56) References Cited

U.S. PATENT DOCUMENTS

| | | | |
|---|---|---|---|
| 4,069,430 A | 1/1978 | Masuda | |
| 4,140,964 A | 2/1979 | Eubank et al. | |
| 5,404,109 A * | 4/1995 | Pribble et al. | 324/603 |
| 5,936,419 A | 8/1999 | Chen | |
| 6,429,676 B1 | 8/2002 | Chun et al. | |
| 2004/0008043 A1* | 1/2004 | Thomas et al. | 324/715 |
| 2006/0043981 A1* | 3/2006 | Drouin et al. | 324/713 |

FOREIGN PATENT DOCUMENTS

JP 2000-46896 A 2/2000

* cited by examiner

*Primary Examiner*—Vincent Q Nguyen
(74) *Attorney, Agent, or Firm*—Frank R. Niranjan

(57) ABSTRACT

A method for testing voltage endurance of a electronic component, includes: generating an oscillating signal; amplifying the oscillating signal; transforming the amplified oscillating signal to generate a transformed signal; blocking a negative voltage of the transformed signal to generate a test signal to be transmitted to the electronic component; and detecting electrical characteristics of the electronic component to generate result data.

18 Claims, 5 Drawing Sheets

SYSTEM AND METHOD FOR TESTING VOLTAGE ENDURANCE

BACKGROUND OF THE INVENTION

1. Field of the Invention

The present invention generally relates to a test system and, particularly, to a system and method for testing voltage endurance.

2. Description of Related Art

Electronic devices usually include many kinds of electronic components, such as diodes, bipolar junction transistors, MOSFETs, and capacitors. Breakdown voltage is an important parameter when evaluating performance of the electronic components. Take a diode as an example, if the breakdown voltage of the diode is below a certain minimum as required by the electronic device, the diode will conduct reversely, which can causes unexpected results.

A voltage endurance of an electronic component is tested before assembling the electronic component into the electronic device so as to make sure the electronic component will not be damaged by a largest voltage in the electronic device. Referring to FIG. 5, a traditional test apparatus 500 includes a microcontroller 510, a digital to analog (D/A) converter 520, a power amplifier 530, and a transformer 540. The microcontroller 510 generates a digital signal and transmits the digital signal to the D/A converter 520. The digital signal is converted into an analog signal by the D/A converter 520. The analog signal is then amplified and transmitted to the transformer 540 by the power amplifier 530. The transformer 540 transforms voltage of the amplified analog signal to generate an alternating current (AC) voltage. The AC voltage is transmitted to the electronic component as a test signal for testing the electronic component.

However, a negative voltage in the test signal will affect precision of a test result. For example, a negative electric potential generated by the negative voltage and stored in capacitors will counteract a part of the test signal in positive voltage.

Therefore, an improved system and method for testing voltage endurance is desired.

SUMMARY OF THE INVENTION

A system for testing voltage endurance of an electronic component, includes a signal generator, a power amplifier, a transform unit, a signal adjust unit, and a voltage reading module. The signal generator is used for generating an oscillating signal. The power amplifier is connected to the signal generator for receiving and amplifying the oscillating signal. The transform unit is coupled to the power amplifier for transforming the amplified oscillating signal to generate a transformed signal. The signal adjust unit is constructed and arranged for blocking a negative voltage of the transformed signal to generate a test signal to be transmitted to the electronic component. The voltage reading module is coupled to the electronic component for detecting electrical characteristics of the electronic component to generate result data.

A method for testing voltage endurance of an electronic component, includes: generating an oscillating signal; amplifying the oscillating signal; transforming the amplified oscillating signal to generate a transformed signal; blocking a negative voltage of the transformed signal to generate a test signal to be transmitted to the electronic component; and detecting electrical characteristics of the electronic component to generate result data.

Other advantages and novel features will become more apparent from the following detailed description of preferred embodiments when taken in conjunction with the accompanying drawings, in which:

BRIEF DESCRIPTION OF THE DRAWINGS

Many aspects of the system and method for testing voltage endurance can be better understood with reference to the following drawings. The components in the drawings are not necessarily to scale, the emphasis instead being placed upon clearly illustrating the principles of the present system. Moreover, in the drawings, like reference numerals designate corresponding parts throughout the several views.

DETAILED DESCRIPTION OF THE INVENTION

Reference will now be made to the drawings to describe a preferred embodiment of the present system and method for testing voltage endurance.

Figure 1:
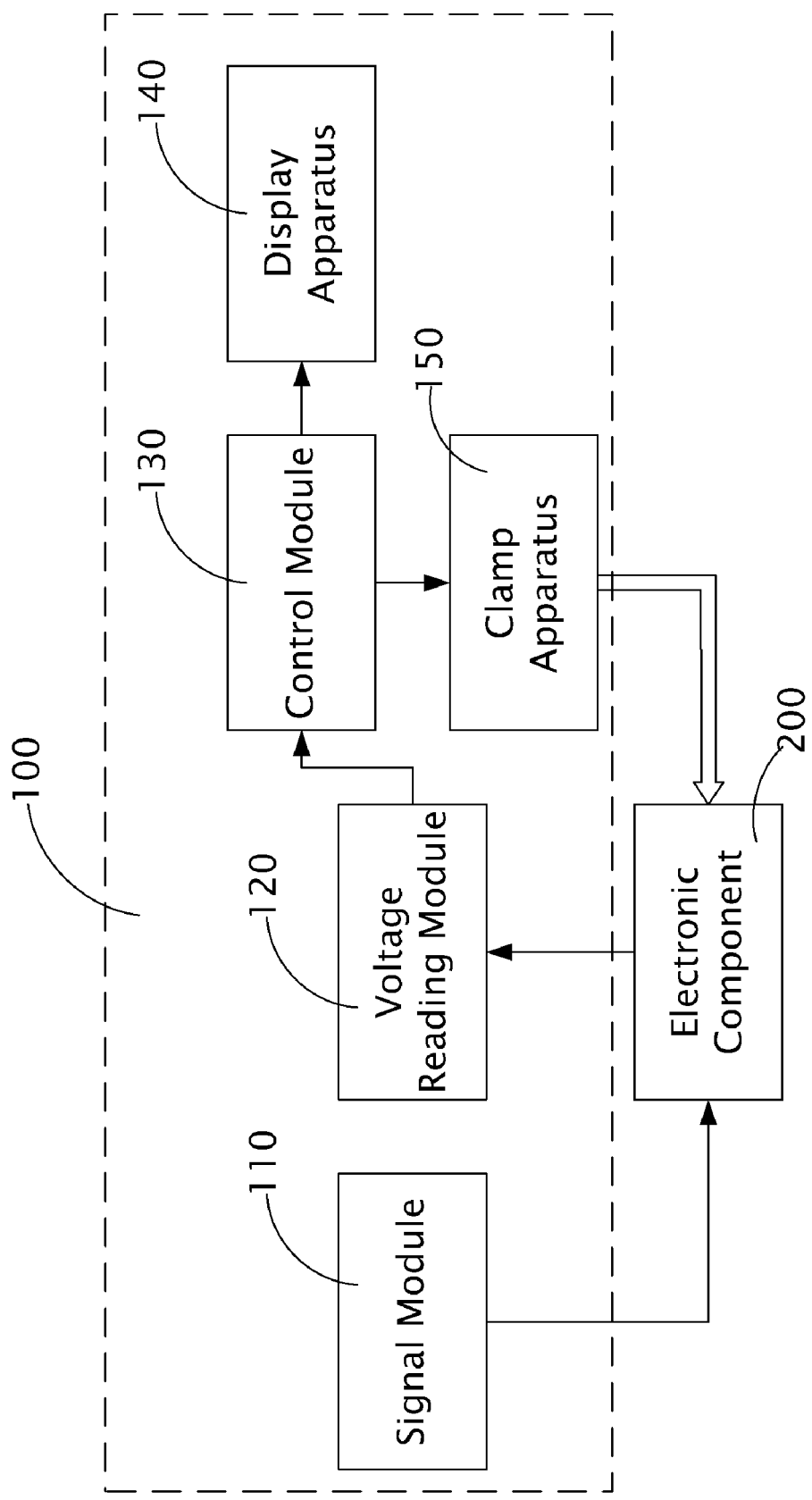
FIG. 1 is a block diagram of a test system in accordance with an exemplary embodiment.

Referring to FIG. 1, a block diagram of a test system 100 for testing voltage endurance of an electronic component 200 in accordance with an exemplary embodiment is illustrated. The test system 100 includes a signal module 110, a voltage reading module 120, a control module 130, a display apparatus 140, and a clamp apparatus 150.

The signal module 110 is configured to connected to the electronic component 200 and to transmit a test signal to the electronic component 200.

The voltage reading module 120 is used for detecting the electronic component 200 while the test signal is transmitted to the electronic component 200.

The control module 130 is coupled to the voltage reading module 120, the display apparatus 140, and the clamp apparatus 150 respectively. The control module 130 is configured for receiving result data from the voltage reading module 120, controlling information displayed on the display apparatus 140, and signaling the clamp apparatus 150 to clamp or release the electronic component 200. Before testing the voltage endurance of the electronic component 200, the clamp apparatus 150 clamps the electronic component to be connected to the test system 100.

Figure 2:
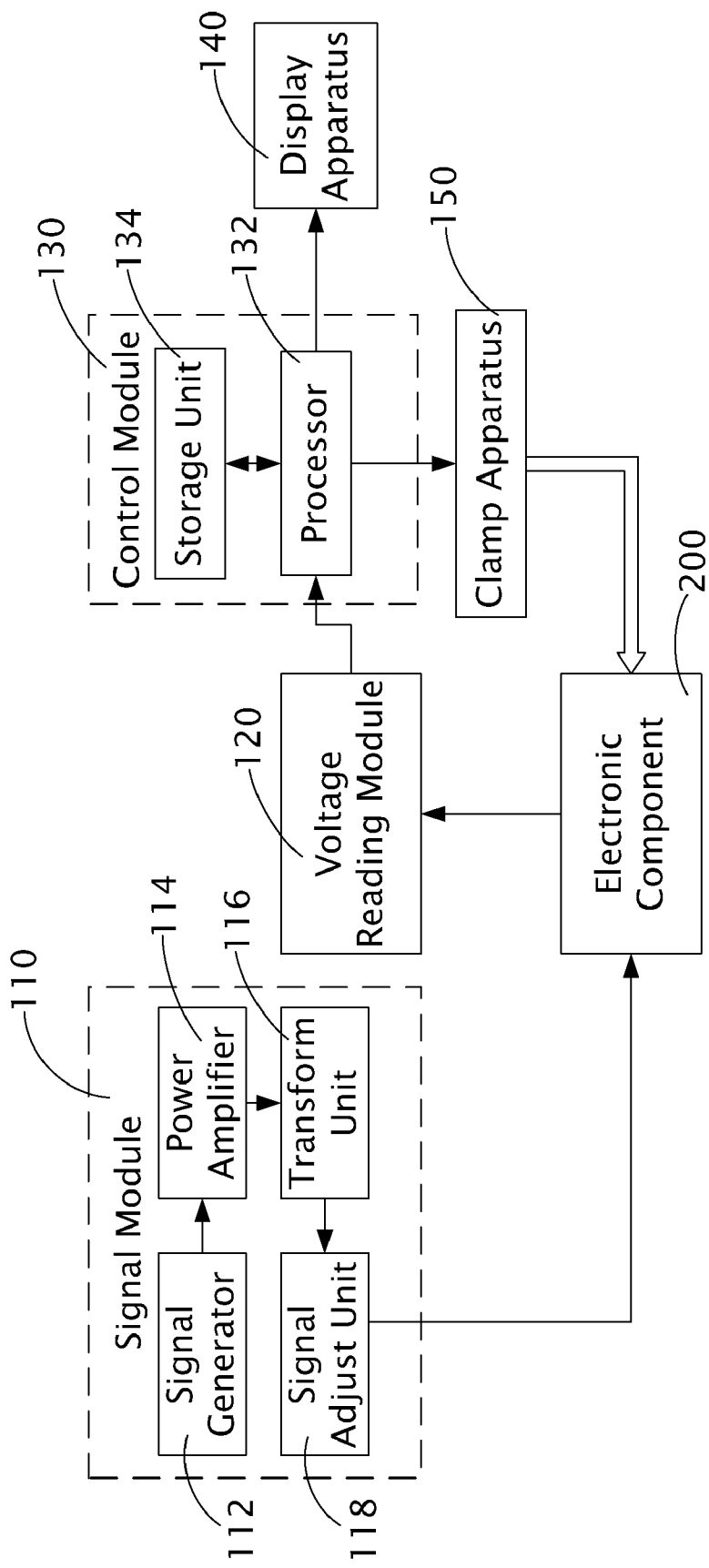
FIG. 2 is a detailed block diagram of the test system of FIG. 1.

Referring to FIG. 2, a detailed block diagram of the test system 100 is illustrated. The signal module 110 includes a signal generator 112, a power amplifier 114, a transform unit 116, and a signal adjust unit 118.

The signal generator 112 is configured for outputting an oscillating signal. The signal generator 112 can be selected from a group consisting of a resistor-capacitor (RC) oscillator, a timer circuit, and any other sine wave or square wave signal generating circuits.

The power amplifier 114 is connected to the signal generator 112 for receiving and amplifying the oscillating signal. The power amplifier 114 can be selected from a group consisting of a transistor amplifier and an integrated circuit amplifier.

The transform unit 116 is coupled to the power amplifier 114 for transforming the amplified oscillating signal to a transformed signal.

The signal adjust unit 118 is configured for receiving and adjusting the transformed signal to generate the test signal, such as blocking negative voltages in the transformed signal.

The test signal is transmitted to the electronic component 200 for testing the electronic component 200. The voltage reading module 120 is coupled to the electronic component 200 for detecting electrical characteristics of the electronic component 200, such as a voltage of the electronic component 200. The result data outputted by the voltage reading module 120 based on the electrical characteristics is transmitted to the control module 130 for further analyzing. Generally, if the electronic component 200 is damaged, a resistance of the electronic component 200 drops near to zero rapidly. Thus the voltage of the electronic component 200 drops accordingly.

The control module 130 includes a processor 132 and a storage unit 134. The storage unit 134 is used for storing a predetermined value. The processor 132 is configured for comparing the result data with the predetermined value, so as to determine whether the electronic component 200 meets a predefined design requirement, in a preferred embodiment the design requirement represent a voltage endurance value that indicates the electronic component 200 is eligible for being assembled in an electronic device. If the electronic component 200 is eligible for being assembled in the electronic device, the processor 132 sends a first instruction to the display apparatus 140 and the clamp apparatus 150. In response to the first instruction, the display apparatus 140 displays eligible information of the electronic component 200 on the display apparatus 140, and the clamp apparatus 150 releases the electronic component 200 to a first area that stores eligible tested electronic components and clamps a next electronic component 200. If the electronic component 200 is not eligible for being assembled in the electronic device, the processor 132 sends a second instruction to the display apparatus 140 and the clamp apparatus 150. In response to the second instruction, the display apparatus 140 displays that the electronic component 200 is not eligible for being assembled in the electronic device on the display apparatus 140, and the clamp apparatus 150 releases the electronic component 200 to a second area that stores ineligible electronic components and clamps the next electronic component. Exemplarily, the clamp apparatus 150 is a pneumatic clamp.

Figure 3:
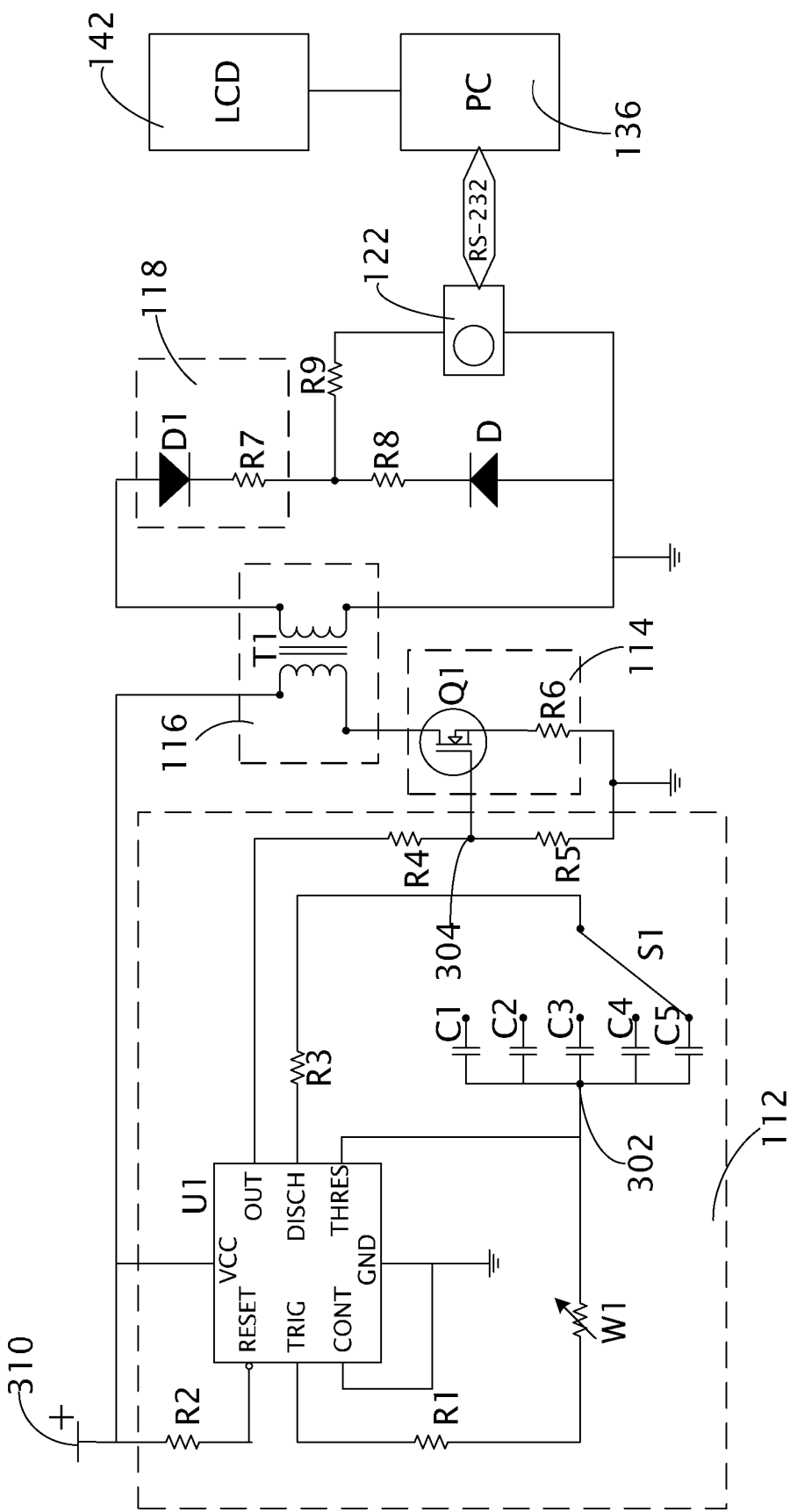
FIG. 3 is a schematic diagram of an exemplary circuit.

Referring to FIG. 3, a schematic diagram of an exemplary circuit is illustrated. In the exemplary circuit, a test diode D is employed as an example of the electronic component 200. The signal generator 112 includes a timer Integrated Circuit (IC) U1, a variable resistor W1, five resistors R1~R5, five capacitors C1~C5, and a switch S1. The power amplifier 114 includes a MOSFET Q1 and a resistor R6. The transform unit 116 includes a transformer T1. The signal adjust unit 118 includes a blocking diode D1 and resistors R7~R9. The voltage reading module 120 includes a digital multimeter 122. The control module 130 is a computer 136 connected to the digital multimeter 122 via a RS-232 interface. The display module 140 is a LCD monitor 142 coupled to the computer 136 for displaying information.

The timer IC U1 includes a ground port GND, a control port CONT, a trigger port TRIG, a reset port REST, a voltage supply port VCC, an output port OUT, a discharge port DISCH, and a threshold port THRES. The ground port GND and the control port CONT are connected to the ground. The trigger port TRIG is connected to a common node 302 of the capacitors C1~C5 via the resistor R1 and the variable resistor W1. The threshold port THRES is connected to the common node 302. The discharge port DISCH is connected to one end of the switch S1 via the resistor R3, another end of the switch S1 can be selectively connected to the capacitors C1~C5. The output port OUT is connected to ground via the resistor R4 and the resistor R5. The reset port REST is connected to a voltage source terminal 310 via the resistor R2. The voltage supply port VCC is connected to the voltage source terminal 310 directly.

An end of a primary winding of the transformer T1 is connected to the voltage source terminal 310, another end of the primary winding of the transformer T1 is connected to the drain terminal of the MOSFET Q1. The source terminal of the MOSFET Q1 is grounded via the resistor R6. The gate terminal of the MOSFET Q1 is connected to the interconnection between the resistor R4 and the resistor R5. An end of a secondary winding of the transformer T1 is grounded; another end of the secondary winding of the transformer T1 is connected to the anode of the blocking diode D1. The cathode of the blocking diode D1 is connected to the cathode of the test diode D via the resistor R7 and the resistor R8. The anode of the test diode D is grounded. The resistor R9 and the digital multimeter 122 are connected in serial and then are parallel to the resistor R8 and the test diode D.

In operation, the oscillating signal is generated by the timer IC U1 and outputted from the output port OUT. A frequency and duty of the oscillating signal can be adjusted by adjusting the variable resistor W1 and selecting one of the capacitors C1~C5. The oscillating signal is amplified by the MOSFET Q1. The gate terminal of the MOSFET Q1 is connected to the interconnection between the resistor R4 and the resistor R5, thus a voltage inputted to the gate terminal can be adjusted by setting resistance values of the resistor R4 and the resistor R5.

The drain terminal of the MOSFET Q1 is connected to the primary winding of the transformer T1, the amplified oscillating signal is transmitted to the transformer T1. The transformer T1 transforms the amplified oscillating signal to generate the transformed signal and output the transformed signal from the secondary winding. The transformed signal is transmitted to the blocking diode D1. The blocking diode D1 is configured for blocking the negative voltage in the transformed signal and generating the test signal. The resistors R7 and R8 are serially connected to the test diode D for dividing the voltage applied on the test diode D. The digital multimeter 122 generates the result data according to the voltage detected from the test diode D. The result data is transmitted to the computer 136 via the RS-232 interface. The computer 136 determines whether the test diode D is eligible or not eligible for being assembled in the electronic device. Generally, the test signal is configured to output the largest voltage to be applied to the test diode. If the test diode D is not breakdown under the largest voltage, thus the digital multimeter 122 will detect a voltage value close to the largest voltage, and the test diode D is eligible for being assembled in the electronic device. If the test diode D is breakdown under the largest voltage, the resistance of the test diode D drops rapidly to almost zero and the voltage of the test diode D drops accordingly. Thus the test diode D is not eligible for being assembled in the electronic device.

The test system 100 blocks the negative voltage by the blocking diode D1, thus an effect of the negative voltage is avoided. The oscillating signal is generated by the timer IC U1, thus the microcontroller and digital to analog converter are not required by the test system 100. The clamp apparatus 150 clamps and releases the electronic component 200 automatically under the control of the control module 130. Therefore, prevention actions for electrostatic discharge of manually operation are not required.

Figure 4:
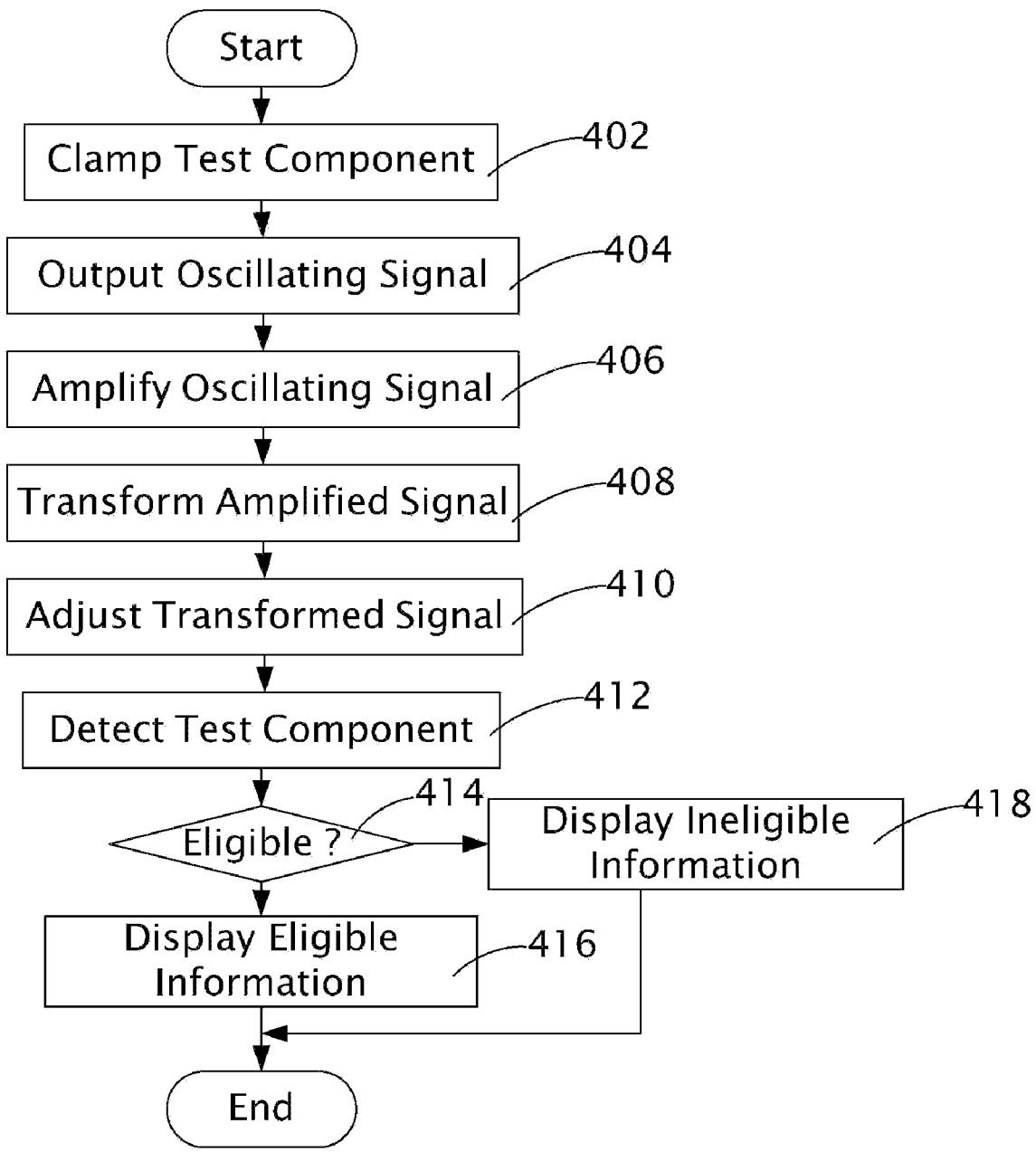
FIG. 4 is a flow chart illustrating a procedure of a method for testing voltage endurance in accordance with an exemplary embodiment.
Figure 5:
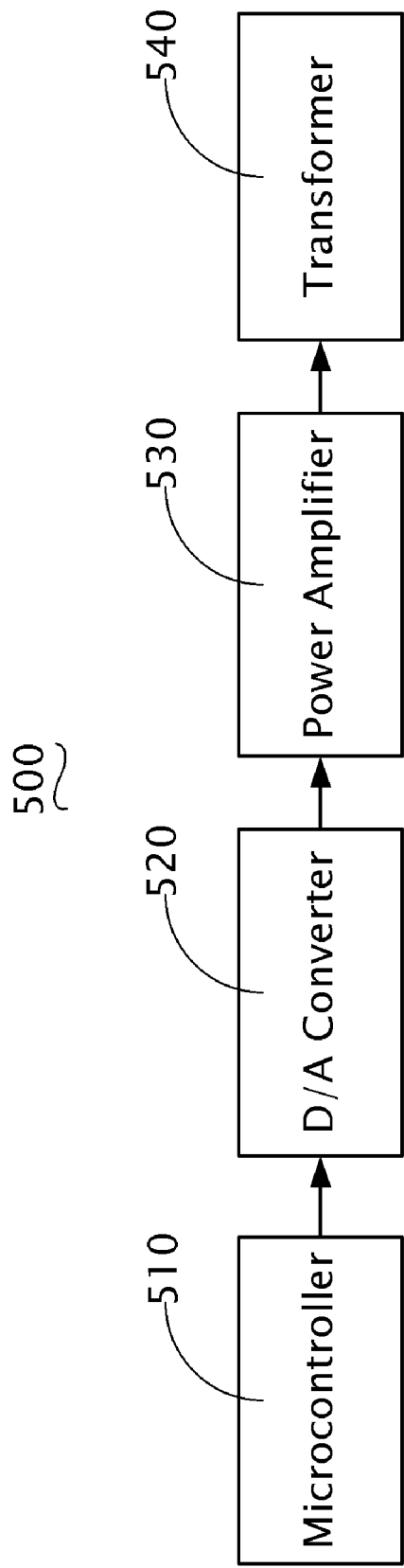
FIG. 5 is a diagram of a conventional test apparatus.

Referring to FIG. 4, an exemplary method for testing the voltage endurance of the electronic component 200 is illustrated. First, in step 402, the clamp apparatus 150 clamps the electronic component 200 and connects the electronic component 200 to the test system 100.

Then in step 404, the signal generator 112 outputs the oscillating signal.

In step 406, the power amplifier 114 receives and amplifies the oscillating signal.

In step 408, the transform unit 116 transforms the amplified oscillating signal to generate the transformed signal that includes the largest voltage to test the electronic component 200.

In step 410, the signal adjust unit 118 receives and adjusts the transformed signal to generate the test signal.

In step 412, the voltage reading module 120 detects the electrical characteristics of the electronic component 200, such as the voltage of the electronic component 200. The result data generated by the voltage reading module 120 based on the electrical characteristics is transmitted to the control module 130 for further analyzing.

In step 414, the control module 130 determines whether the electronic component 200 is eligible or not eligible for being assembled in the electronic device. If the electronic component 200 is eligible for being assembled in the electronic device, the first instruction is sent to the display apparatus 140 and the clamp apparatus 150. In response to the first instruction, the display apparatus 140 displays the eligible information on the display apparatus 140, and the clamp apparatus 150 releases the electronic component 200 to the first area for storing the eligible electronic components and clamps the next electronic component (step 416). If the electronic component 200 is not eligible for being assembled in the electronic device, the second instruction is sent to the display apparatus 140 and the clamp apparatus 150. In response to the second instruction, the display apparatus 140 displays the ineligible information on the display apparatus 140, and the clamp apparatus 150 releases the electronic component 200 to the second area for storing the ineligible electronic components and clamps the next electronic component (step 418).

The embodiments described herein are merely illustrative of the principles of the present invention. Other arrangements and advantages may be devised by those skilled in the art without departing from the spirit and scope of the present invention. Accordingly, the present invention should be deemed not to be limited to the above detailed description, but rather by the spirit and scope of the claims that follow, and their equivalents.

What is claimed is:

1. A system for testing voltage endurance of an electronic component, comprising:
   a signal generator for outputting an oscillating signal;
   a power amplifier connected to the signal generator for receiving and amplifying the oscillating signal, thereby yielding an amplified oscillating signal;
   a transform unit coupled to the power amplifier for transforming the amplified oscillating signal thereby yielding a transformed signal;
   a signal adjust unit configured for blocking a negative voltage of the transformed signal and generating a test signal to be transmitted to the electronic component; and
   a voltage reading module coupled to the electronic component for detecting electrical characteristics of the electronic component when the test signal is transmitted to the electronic component and generating result data according to the electrical characteristics.

2. The system as claimed in claim 1, wherein the signal generator comprises a timer integrated circuit for generating the oscillating signal.

3. The system as claimed in claim 2, wherein the signal generator further comprises a variable resistor and a plurality of capacitors connected to the timer IC.

4. The system as claimed in claim 3, wherein a frequency and duty cycle of the oscillating signal can be adjusted by adjusting the variable resistor and selecting one of the plurality of capacitors.

5. The system as claimed in claim 1, wherein the power amplifier comprises a MOSFET, the gate terminal of the MOSFET is connected to the signal generator for receiving and amplifying the oscillating signal.

6. The system as claimed in claim 1, wherein the transform unit is a transformer.

7. The system as claimed in claim 6, wherein the signal adjust unit comprises a diode for blocking the negative voltage in the transformed signal.

8. The system as claimed in claim 1, wherein the signal adjust unit further comprises a resistor for dividing a voltage of the transformed signal.

9. The system as claimed in claim 1, wherein the system further comprises a control module for computing whether the electronic component is eligible for being assembled in an electronic device based on the result data.

10. The system as claimed in claim 9, wherein the control module further comprises a storage unit for storing a predetermined value and a processor for comparing the result data with the predetermined value to determine whether the electronic component is eligible for being assembled in the electronic device.

11. The system as claimed in claim 9, wherein the system further comprises a display apparatus for displaying eligible information and ineligible information.

12. The system as claimed in claim 9, wherein the system further comprises a clamp apparatus for clamping and releasing the electronic component.

13. The system as claimed in claim 12, wherein the clamp apparatus is a pneumatic clamp.

14. A method for testing voltage endurance of an electronic component, comprising:
   outputting an oscillating signal;
   amplifying the oscillating signal thereby yielding an amplified signal;
   transforming the amplified signal thereby yielding a transformed signal;
   blocking a negative voltage of the transformed signal to generate a test signal to be transmitted to the electronic component; and
   detecting electrical characteristics of the electronic component to generate result data.

15. The method as claimed in claim 14, wherein a frequency and duty cycle of the oscillating signal is adjustable.

16. The method as claimed in claim 14, further comprising: determining whether the electronic component is eligible for being assembled in an electronic device based on the result data.

17. The method as claimed in claim 16, further comprising: displaying eligible information and ineligible information.

18. The method as claimed in claim 14, further comprising: displaying the result data.

* * * * *